United States Patent
Wu et al.

(10) Patent No.: US 10,200,891 B2
(45) Date of Patent: Feb. 5, 2019

(54) WIRELESS COMMUNICATION DEVICE

(71) Applicant: GEMTEK TECHNOLOGY CO., LTD., Hsinchu (TW)

(72) Inventors: Jie-Yuan Wu, Hsinchu (TW); Kuo-Tsai Lee, Hsinchu (TW); Yu-Lin Hsieh, Hsinchu (TW)

(73) Assignee: GEMTEK TECHNOLOGY CO., LTD., Hsinchu (TW)

( * ) Notice: Subject to any disclaimer, the term of this patent is extended or adjusted under 35 U.S.C. 154(b) by 54 days.

(21) Appl. No.: 15/439,848

(22) Filed: Feb. 22, 2017

(65) Prior Publication Data

US 2018/0041910 A1    Feb. 8, 2018

Related U.S. Application Data

(60) Provisional application No. 62/370,605, filed on Aug. 3, 2016.

(51) Int. Cl.
*H04W 24/04* (2009.01)
*H04L 29/12* (2006.01)

(52) U.S. Cl.
CPC ......... *H04W 24/04* (2013.01); *H04L 61/6022* (2013.01)

(58) Field of Classification Search
CPC .................... H04W 24/04; H04L 61/6022
USPC ................................. 370/241, 252
See application file for complete search history.

(56) References Cited

U.S. PATENT DOCUMENTS

| | | | |
|---|---|---|---|
| 5,557,744 A | 9/1996 | Kobayakawa et al. | |
| 5,982,294 A | 11/1999 | Takayama et al. | |
| 2015/0268101 A1 | 9/2015 | Kumahara et al. | |
| 2016/0022141 A1* | 1/2016 | Mittal | A61B 5/0002 340/870.07 |
| 2016/0321081 A1* | 11/2016 | Kim | G06F 9/441 |

FOREIGN PATENT DOCUMENTS

| | | |
|---|---|---|
| JP | 09-186678 A | 7/1997 |
| JP | 2000-083062 A | 3/2000 |
| JP | 2002-344377 A | 11/2002 |
| JP | 2004-040212 A | 2/2004 |
| JP | 2004-048394 A | 2/2004 |
| JP | 2012-115373 A | 6/2012 |
| JP | 2013-009231 A | 1/2013 |
| JP | 2014-165636 A | 9/2014 |
| WO | 2014/016867 A1 | 1/2014 |

OTHER PUBLICATIONS

Japanese Office Action for corresponding application No. 2017-050823, dated May 8, 2018.

* cited by examiner

*Primary Examiner* — Obaidul Huq
(74) *Attorney, Agent, or Firm* — Maschoff Brennan

(57) ABSTRACT

A wireless communication device includes a wireless transceiver, an analog-to-digital converter (ADC), and a processor. The ADC is configured to read a sensing value to generate a piece of sensing data. The processor is electrically connected to the wireless transceiver and the ADC. When an interrupt request is detected, the processor sends the piece of sensing data via the wireless transceiver.

8 Claims, 4 Drawing Sheets

WIRELESS COMMUNICATION DEVICE

CROSS-REFERENCE TO RELATED APPLICATIONS

This non-provisional application claims priority under 35 U.S.C. § 119(e)(1) on Provisional Application No(s). 62/370,605 filed in the U.S. on Aug. 3, 2016, the entire contents of which are hereby incorporated by reference.

TECHNICAL FIELD

The disclosure relates to a wireless communication device, more particularly to a wireless communication device adopted for Internet of Things (IoT) technology.

BACKGROUND

Wireless communication devices provide capability of communicating wirelessly, and therefore they are widely adopted for many kinds of devices and applications. Wireless communication devices usually comprise baseband and wireless transceiver, and are controlled by electronic devices as a slave device.

Data transmission of environmental and device status monitoring have gradually become an application for wireless communication devices with the development of IoT. However, to install extra controlled wireless communication devices on electronic devices or to install extra main processor on sensor may not only increase the difficulties of devices, but may also expand the volume of wireless communication devices. How to provide a wireless communication device that may operate without master devices thus becomes a problem to be solved.

SUMMARY

With respect to the problem described above, a wireless communication device is provided in the present disclosure, which is capable of self receiving and transmitting sensing data.

According to an embodiment of the present disclosure, a wireless communication device is disclosed. The wireless communication comprises a wireless transceiver, an analog-to-digital converter (ADC), and a processor. The ADC is configured to read a sensing value to generate a piece of sensing data. The processor is electrically connected to the wireless transceiver and the ADC. When an interrupt request is detected, the processor sends the piece of sensing data via the wireless transceiver.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
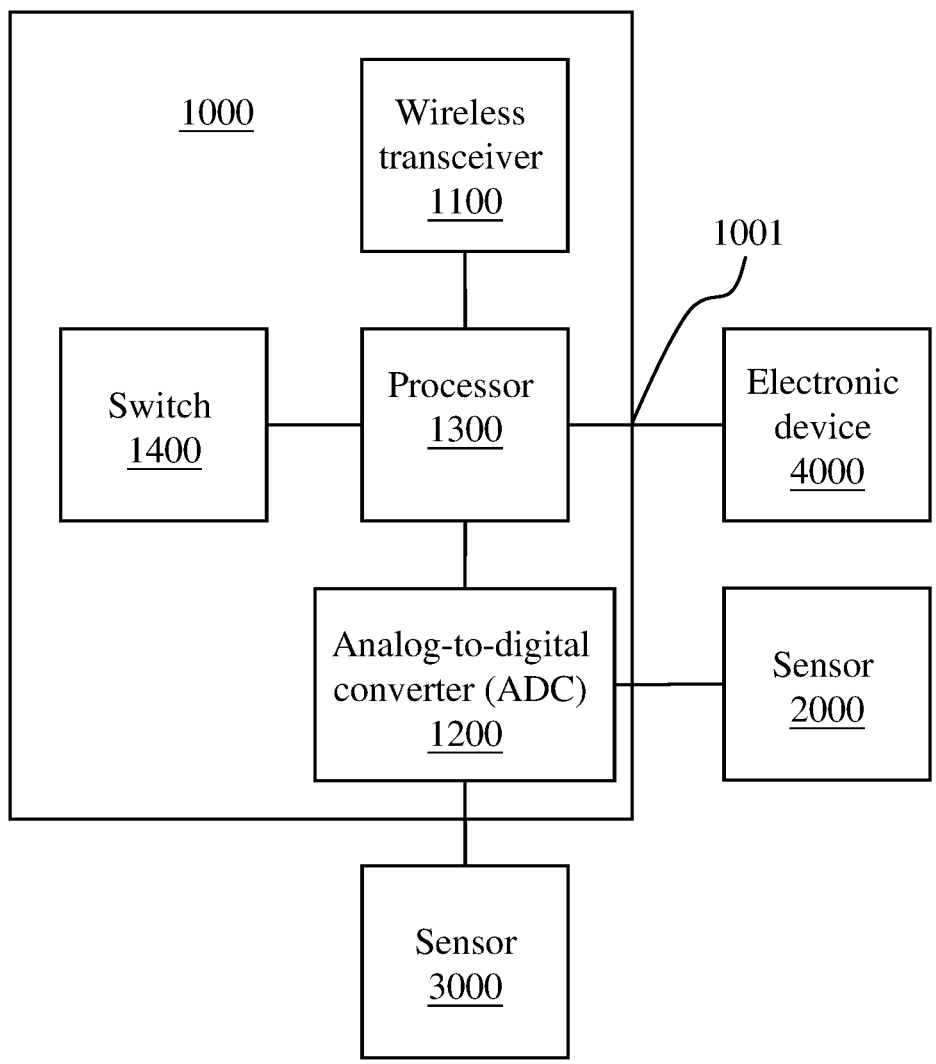
FIG. 1 is a schematic view illustrating the functional block of the wireless communication device of an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic view illustrating the functional block of the wireless communication device of an embodiment of the present disclosure. As shown in FIG. 1, the wireless communication device 1000 comprises a wireless transceiver 1100, an analog-to-digital converter (ADC) 1200 and a processor 1300.

When the wireless communication device 1000 is under use, the ADC 1200 is connected to one or more sensors for reading the sensing value on it and then to generate sensing data. An exemplary of ADC 1200 being connected to two sensors 2000, 3000 would be taken for the following description; however the sensor amounts may be adjusted by person with ordinary skill in the art with respect to different demands and thus should not be limiting the scope of the present discloser. In the present embodiment, sensor 2000 may be, but not limited to, a temp sensor, and sensor 3000 may be, but not limited to, a humidity sensor. The ADC 1200 may be such as flash ADC, successive approximation ADC, delta-sigma ADC, pipeline ADC or other kinds of ADC.

In an exemplary embodiment, sensor 2000 and sensor 3000 are installed in a ward (ward No. 2046), sensor 2000 updates the temp sensing value to the ADC 1200 every 15 seconds and sensor 3000 updates the humidity sensing value to the ADC 1200 every 30 seconds. ADC 1200 switches once every 30 seconds. For example, at 10:05:00 in the morning, the ADC 1200 reads the temp sensing value sent back from the sensor 2000, and at 10:05:30 am, the ADC 1200 reads the humidity sensing value sent back from the sensor 3000. The sensing value would be transformed into sensing data and sent to the processor 1300 after ADC 1200 read the sensing value.

The processor 1300 is electrically connected to the wireless transceiver 1100 and the ADC 1200, and the processor 1300 transmits via the wireless transceiver 1100 the sensing data after detecting an interrupt request. In one embodiment, processor 1300 is in-built with a register or a flash memory, and when receiving the sensing data sent from the ADC 1200, the sensing data stored in the register/flash memory would be updated. In one embodiment, flags are attached to the sensing data sent from ADC 1200 to the processor 1300, thus the processor 1300 may, based on the flag attached to each of the sensing data, determine to update a corresponding sensing data stored in the register/flash memory. When the processor 1300 receives an interrupt request, the processor 1300 sends via the wireless transceiver 1100 the sensing data stored in the register/flash memory. In one embodiment, in order to allow the server receiving the sensing data to identify the source of the sensing data, the processor 1300 would write one or more sensing data with a media access control address (MAC address) into a package, and transmits via the wireless transceiver 1100.

In one embodiment, the processor 1300 reads the predetermined value when the wireless communication device 1000 is activated. When the predetermined value is at a first status, the processor 1300 waits for the interrupt request sent from an electronic device 4000 electrically connected with the wireless communication device 1000. Further, when the predetermined value is a second status, the processor 1300 periodically generates the interrupt request.

To be more specific, the wireless communication device 1000 is controlled by the electronic device 4000 when the predetermined value is at the first status. That is to say, when under this condition, the wireless communication device 1000 is used to transmit the wireless signal the electronic device 4000 wants to transmit. In addition, when the predetermined value is at the second status, the wireless communication device 1000 may, without electronic device 4000, read the sensing value from the connected sensor and send the value to the corresponding server.

In one embodiment, the connection port 1001 of the wireless communication device 1000 for connecting the electronic device 4000 has a detection pin. When the electronic device 4000 is not connected to the connection port 1001, the detection pin lets the predetermined value to be at a second status. In the contrary, when the electronic device 4000 is connected to the connection port 1001, the detection pin lets the predetermined value to be at a first status. In one exemplary, the detection pin is configured to correspond to the ground pin of the electronic device, and the detection pin is connected to the power source high voltage terminal of the wireless communication device 1000 through a resistor. Thus, when the connection port 1001 is not connected the electronic device 4000, the voltage of the detection pin is at high level (the second status), and low level (the first status) otherwise. The above mentioned aspect/performance should be construed as an exemplary; a person with ordinary skill in the art may alter or modify the detection pin for detecting electronic device, and thus should not be limiting the scope of the present disclosure.

In one embodiment, as shown in FIG. 1, the wireless communication device 1000 further comprises a switch 1400. The status of the switch 1400 corresponds to the predetermined value. For instance, the switch 1400 comprises a pressing and releasing status, wherein the pressing status corresponds to the first status of the predetermined value and the releasing status corresponds to the second status of the predetermined value. In other words, when the switch 1400 is pressed, the predetermined value is at the first status, and the processor 1300 would periodically generate the interrupt request. When the switch 1400 is not being pressed, the predetermined value is at the second status, and the processor 1300 should be controlled by the electronic device. In another embodiment, the switch 1400 may be installed correspondingly at the perimeter of a connection port 1001, letting the switch 1400 to be pressed when the electronic device 4000 connects to the connection port 1001. The switch 1400 recovers from pressed to releasing status when the electronic device 4000 is removed from the connection port 1001.

In one embodiment, the switch 1400 is not for adjusting the predetermined value. Instead, it is used to generate the interrupt request. When the switch 1400 is activated, the switch 1400 transmits one interrupt request to the processor 1300, letting the processor 1300 to transmit the sensing data at that time via the wireless transceiver 1100. In practical application, when a patient in a ward presses the nurse call button, the current temp and humidity in that ward would be sent out to the server simultaneously, the personnel at the nursing station may then check whether the temp and humidity make the patient uncomfortable.

Figure 2:
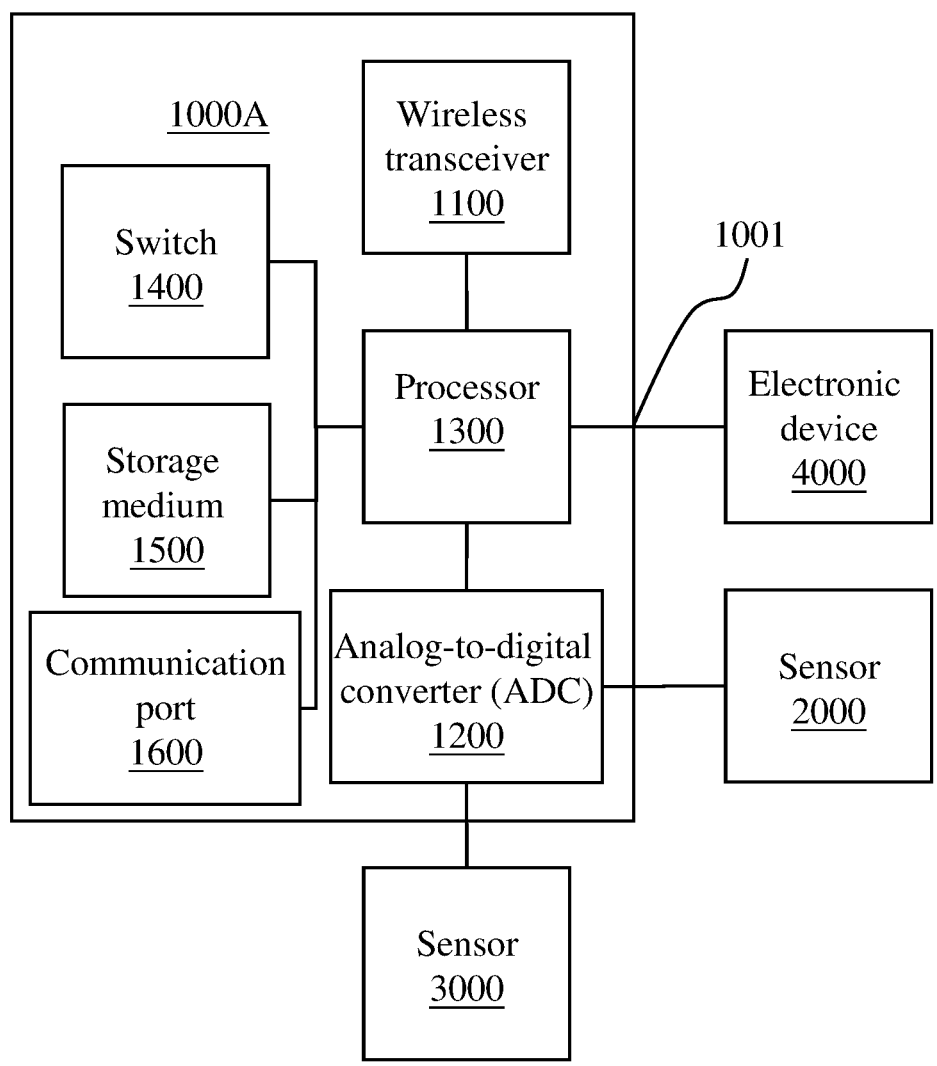
FIG. 2 is a schematic view illustrating the functional block of the wireless communication device of another embodiment of the present disclosure.

In another embodiment, FIG. 2 would be accompanied for description. FIG. 2 is a schematic view illustrating the functional block of the wireless communication device of another embodiment of the present disclosure. As compare to the embodiment of FIG. 1, the wireless communication device 1000A in FIG. 2 further comprises a storage medium 1500 electrically connected to the processor 1300. The storage medium 1500 is configured to store the predetermined value. In the present embodiment, the storage medium 1500 further stores the sensing data transmitted from the ADC 1200 to the processor 1300. In order to read the correct predetermined value for the wireless communication device 1000 when activated, the storage medium 1500 is a non-volatile storage medium. In the present embodiment, users may send an instruction from the server to the wireless transceiver 1100, letting the processor 1300 to receive the instruction via the wireless transceiver 1100 and to correspondingly modify the predetermined value stored in the storage medium 1500. In another embodiment, users may firstly connect the electronic device 4000 to the wireless communication device 1000A, and to control the processor 1300 by the electronic device 4000 for modifying the predetermined value stored in the storage medium 1500. In one embodiment, as shown in FIG. 2, the wireless communication device 1000A may further comprise a switch 1400. When the switch 1400 is activated, the predetermined value in the storage medium is reset to the first status.

To be more specific, in one embodiment, the wireless communication device 1000A is electrically connected to the sensor 2000, sensor 3000 and the electronic device 4000 simultaneously, and the predetermined value stored in the storage medium 1500 is at the second status. The sensing data sent by sensors 2000, 3000 would be written into the storage medium 1500. The processor 1300 periodically generates the interrupt request, to read the sensing data from the storage medium 1500 and to send the sensing data to the server via the wireless transceiver 1100. In the meantime, the electronic device 4000 may transmit the data, together with the instruction and the interrupt request to the processor 1300, letting the processor 1300 to transmit via the wireless transceiver 1100 the data and/or instruction from the electronic device 4000, moreover the sensing data in the storage medium 1500 may also be sent out together. Users may want the wireless communication device 1000A to transmit the sensing data simultaneously when the electronic device 4000 transmits instruction/data in stead of wanting the wireless communication device 1000A to transmit sensing data automatically and periodically. By that, users may, by pressing the switch 1400, letting the predetermined value in storage medium 1500 to be re-written to the first status.

Figure 3:
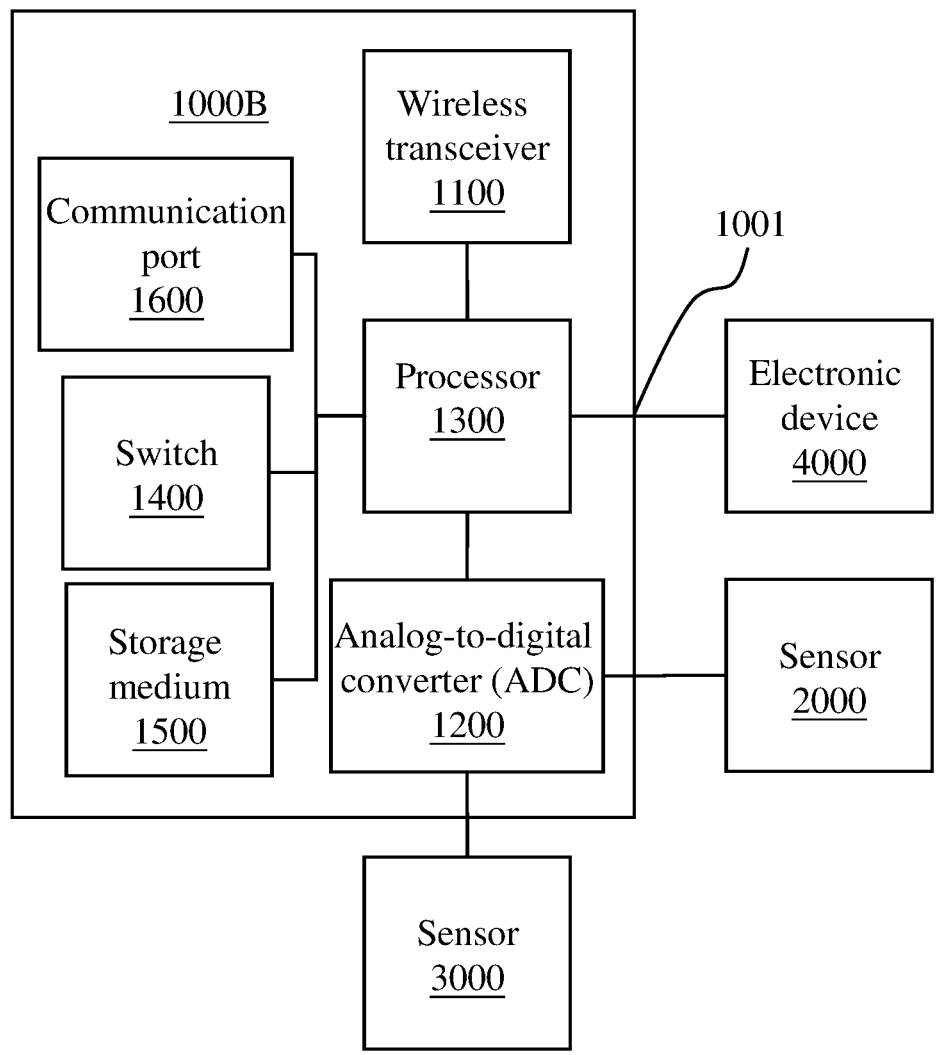
FIG. 3 is a schematic view illustrating the functional block of the wireless communication device of one another embodiment of the present disclosure.

In another embodiment, FIG. 3 would be accompanied for description. FIG. 3 is a schematic view illustrating the functional block of the wireless communication device of one another embodiment of the present disclosure. As compared to the embodiment of FIG. 2, the wireless communication device 1000B further comprises a communication port 1600 electrically connected to the processor 1300, and is configured to modify the predetermined value stored in the storage medium 1500 via the processor 1300. To be more specific, the communication port 1600 may be an inter-integrated circuit ($I^2C$). Users may control the processor 1300 via $I^2C$ to modify the predetermined value.

Figure 4:
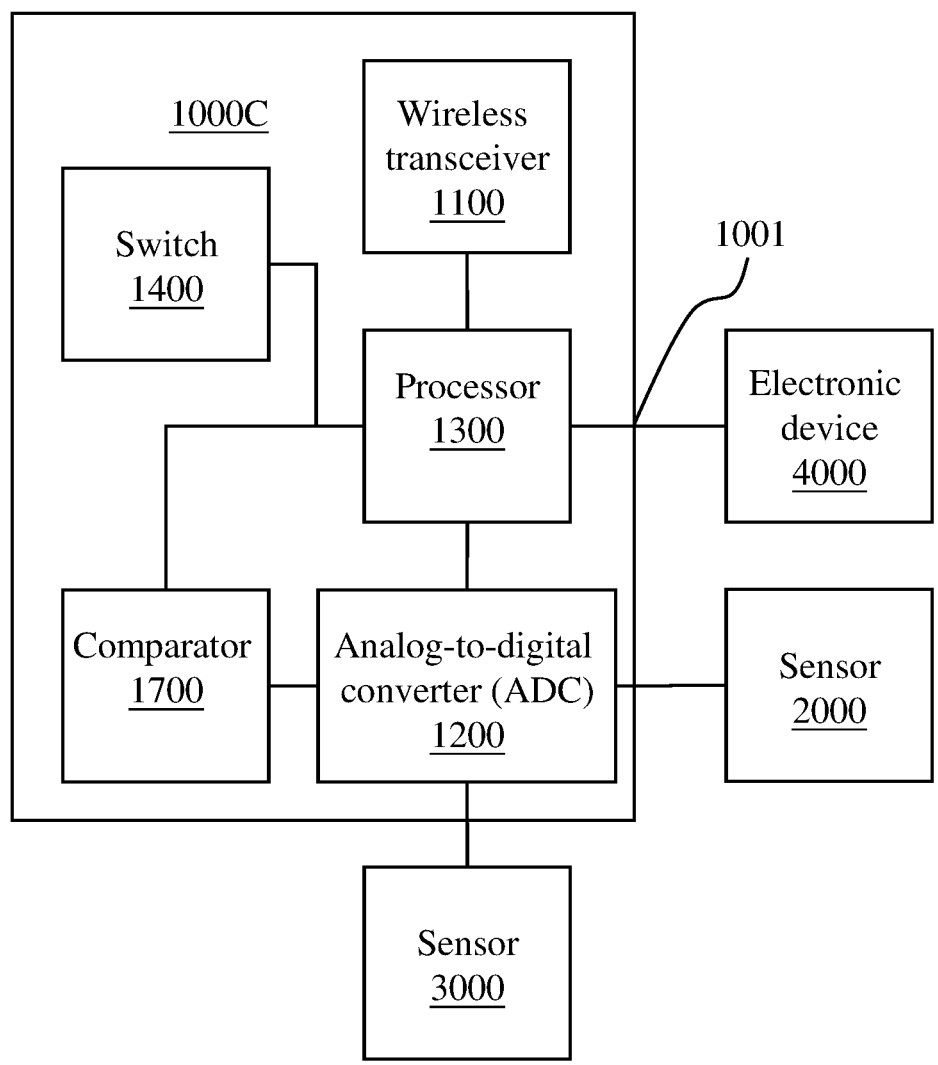
FIG. 4 is a schematic view illustrating the functional block of the wireless communication device of yet another embodiment of the present disclosure.

In another embodiment, FIG. 4 would be accompanied for description. FIG. 4 is a schematic view illustrating the functional block of the wireless communication device of yet another embodiment of the present disclosure. As compare to the embodiment of FIG. 1, the wireless communication device 1000C further comprises a comparator 1700. The comparator 1700 is electrically connected to the processor 1300 and ADC 1200. When the sensing data is accord with the setting condition (e.g. humidity sensing value is greater than a threshold, or temp sensing value is smaller than a threshold), the comparator 1700 sends the interrupt request to the processor 1300. In other words, the wireless communication device 1000C may be transmitting sensing data under certain status.

In summary, according to the wireless communication device in one or more embodiments of the present disclosure, ADC is equipped with to read sensing value, and sensing data is automatically transmitted over periodic/triggering interrupt request.

What is claimed is:

1. A wireless communication device, comprising:
an analog-to-digital converter, configured to read a sensing value to generate a sensing data;
a processor electrically connected to the analog-to-digital converter; and
a wireless transceiver electrically connected to the processor, the processor sending the sensing data via the wireless transceiver when detecting an interrupt request;
wherein the processor reads a predetermined value when activated, and the processor waits for the interrupt request sent from an electronic device when the predetermined value is at a first status and the processor periodically generates the interrupt request when the predetermined value is at a second status.

2. The wireless communication device as claimed in claim 1, wherein the wireless communication device further comprises a storage medium electrically connected to the processor and configured to store the predetermined value.

3. The wireless communication device as claimed in claim 2, wherein the wireless communication device further comprises a communication port electrically connected to the processor and configured to modify via the processor the predetermined value stored in the storage medium.

4. The wireless communication device as claimed in claim 2, wherein the wireless communication device further comprises a switch electrically connected to the storage medium, and the predetermined value is reset to the first status when the switch is activated.

5. The wireless communication device as claimed in claim 1, wherein the wireless communication device further comprises a switch electrically connected to the processor, and the status of the predetermined value is determined by the status of the switch.

6. The wireless communication device as claimed in claim 1, wherein the processor further sends via the wireless transceiver a media access control address when sending the sensing data.

7. The wireless communication device as claimed in claim 1, wherein the wireless communication device further comprises a comparator electrically connected to the processor and the analog-to-digital converter, and the comparator generates the interrupt request when the sensing data meets a predetermined condition.

8. The wireless communication device as claimed in claim 1, wherein the wireless communication device further comprises a switch electrically connected to the processor, and the interrupt request is generated when the switch is activated.

* * * * *